(12) United States Patent
Hsueh et al.

(10) Patent No.: US 8,969,129 B2
(45) Date of Patent: Mar. 3, 2015

(54) RERAM CELLS INCLUDING $TA_XSI_YN$ EMBEDDED RESISTORS

(71) Applicant: Intermolecular Inc., San Jose, CA (US)

(72) Inventors: Chien-Lan Hsueh, Campbell, CA (US); Randall J. Higuchi, San Jose, CA (US); Mihir Tendulkar, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/464,171

(22) Filed: Aug. 20, 2014

(65) Prior Publication Data

US 2014/0357046 A1 Dec. 4, 2014

Related U.S. Application Data

(63) Continuation of application No. 14/136,219, filed on Dec. 20, 2013, now Pat. No. 8,835,890, which is a continuation-in-part of application No. 13/367,662, filed on Feb. 7, 2012, now Pat. No. 8,779,407.

(51) Int. Cl.
*H01L 29/02* (2006.01)
*H01L 45/00* (2006.01)
*H01L 27/24* (2006.01)

(52) U.S. Cl.
CPC .......... *H01L 45/1616* (2013.01); *H01L 45/145* (2013.01); *H01L 45/08* (2013.01); *H01L 45/1233* (2013.01); *H01L 45/1266* (2013.01); *H01L 45/146* (2013.01); *H01L 45/16* (2013.01); *H01L 27/2409* (2013.01); *H01L 27/2463* (2013.01); *H01L 45/12* (2013.01)

USPC .............. 438/102; 438/103; 438/104; 257/2; 257/3; 257/4; 257/5; 257/E29.002

(58) Field of Classification Search
CPC ......... H01L 45/04; H01L 29/00; H01L 27/24; G11C 13/0004
USPC .................................. 257/1–5; 438/102–104
See application file for complete search history.

(56) References Cited

U.S. PATENT DOCUMENTS

| | | | | |
|---|---|---|---|---|
| 4,405,421 | A * | 9/1983 | Inoue | 205/645 |
| 4,931,213 | A * | 6/1990 | Cass | 252/507 |
| 2005/0115828 | A1* | 6/2005 | Fanton et al. | 204/298.13 |
| 2008/0220601 | A1* | 9/2008 | Kumar et al. | 438/585 |
| 2010/0229542 | A1* | 9/2010 | Andy et al. | 60/301 |
| 2011/0070417 | A1* | 3/2011 | Reutler et al. | 428/213 |
| 2012/0028009 | A1* | 2/2012 | Gerardin et al. | 428/212 |

* cited by examiner

*Primary Examiner* — Jami M Valentine

(57) ABSTRACT

Provided are resistive random access memory (ReRAM) cells and methods of fabricating thereof. A ReRAM cell includes an embedded resistor and a resistive switching layer connected in series with this resistor. The resistor is configured to prevent over-programming of the cell by limiting electrical currents through the resistive switching layer. Unlike the resistive switching layer, which changes its resistance in order to store data, the embedded resistor maintains a substantially constant resistance during operation of the cell. The embedded resistor is formed from tantalum nitride and silicon nitride. The atomic ratio of tantalum and silicon may be specifically selected to yield resistors with desired densities and resistivities as well as ability to remain amorphous when subjected to various annealing conditions. The embedded resistor may also function as a diffusion barrier layer and prevent migration of components between one of the electrodes and the resistive switching layer.

20 Claims, 7 Drawing Sheets

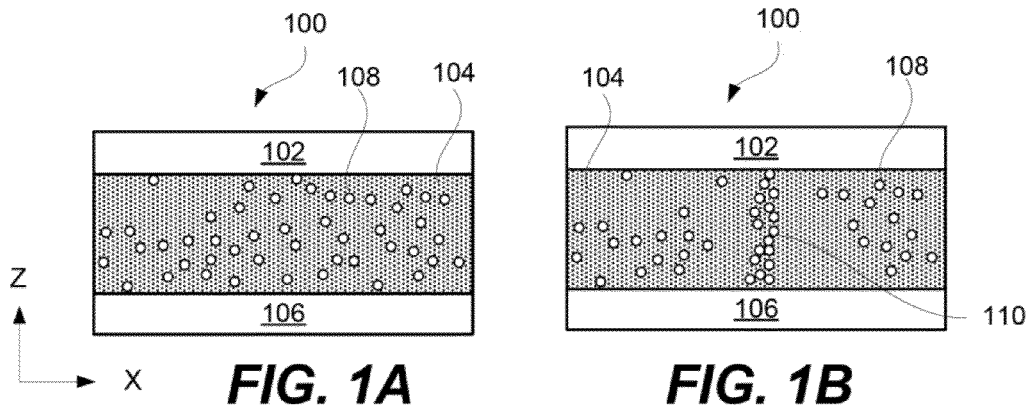
FIG. 1A  FIG. 1B
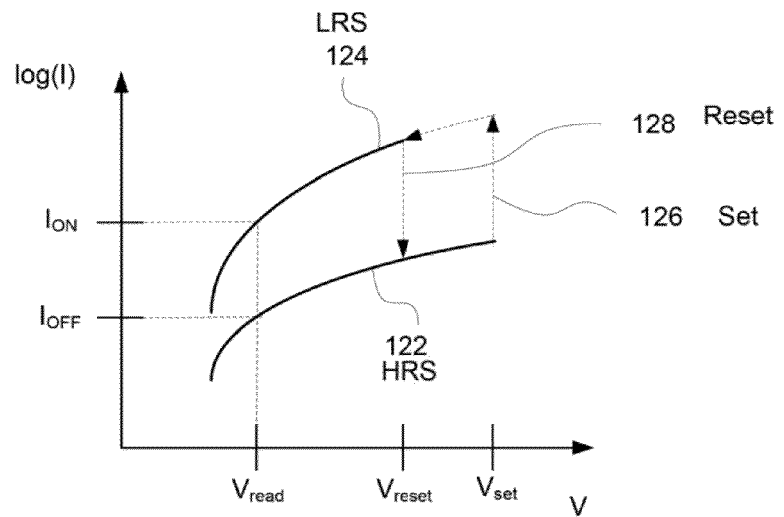
FIG. 2

RERAM CELLS INCLUDING $Ta_XSi_YN$ EMBEDDED RESISTORS

CROSS-REFERENCE TO RELATED APPLICATIONS

This is a Continuation Application of U.S. patent application Ser. No. 14/136,219, filed Dec. 20, 2013, which is a Continuation-In-Part Application of U.S. patent application Ser. No. 13/367,662 (now U.S. Pat. No. 8,779,407), filed Feb. 7, 2012, each of which is herein incorporated by reference in its entirety for all purposes.

TECHNICAL FIELD

The present invention relates generally to non-volatile memory devices and more specifically to resistive random access memory (ReRAM) cells having $Ta_XSi_YN$ embedded resistors, in which concentrations of tantalum and silicon are selected to achieve specific processing and operating characteristics of the ReRAM cells.

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof. A ReRAM cell includes an embedded resistor and a resistive switching layer connected in series with this resistor. The resistor is configured to prevent over-programming of the cell by limiting electrical currents through the resistive switching layer. Unlike the resistive switching layer, which changes its resistance in response to an applied voltage to store data, the embedded resistor maintains a substantially constant resistance during operation of the cell. The embedded resistor is formed from tantalum nitride and silicon nitride. The atomic ratio of tantalum and silicon may be specifically selected to yield resistors with desired densities and resistivities as well as ability to remain amorphous when subjected to various annealing conditions. The embedded resistor may also function as a diffusion barrier layer and prevent migration of components between one of the electrodes and the resistive switching layer.

In some embodiments, a ReRAM cell includes a first electrode, a second electrode, a resistive switching layer, and an embedded resistor. The resistive switching layer is disposed between the first electrode and the second electrode, while the embedded resistor is disposed between the resistive switching layer and the second electrode. The embedded resistor may directly interface one or both of the resistive switching layer and the second electrode. The embedded resistor includes both tantalum nitride and silicon nitride. The composition of the embedded resistor may be presented by $Ta_XSi_YN$ such that both X>0 and Y>0 and that X and Y are selected to yield a predetermined density and a predetermined resistivity of the embedded resistor and to reduce crystallization of $Ta_XSi_YN$ during anneal. Excessive tantalum concentration may cause crystallization of the embedded resistor and rapid resistivity loss. On the other hand, excessive silicon concentration may cause high deviations in resistivity values of the embedded resistor, especially after annealing. In some embodiments, a ratio of X to Y is between about 0.5:1 and about 15:1 or, more specifically, between about 1:1 and about 10:1, or even between about 3:1 and about 5:1.

The $Ta_XSi_YN$ may be substantially amorphous after anneal. For purposes of this document, the term "substantially amorphous" is defined as having less than 5% by volume of the crystalline phase as measured by X-ray diffraction (XRD). In some embodiments, $Ta_XSi_YN$ of the embedded resistor is configured to withstand a temperature of up to 750° C. for up to 60 seconds while remaining substantially amorphous. This annealing condition may be used for activating diodes present on the same substrate with the embedded resistor, or for other purposes. For example, a diode may be a part of the ReRAM cell that also includes the embedded resistor. In some embodiments, the concentration of nitrogen in the embedded resistor may be between 20% atomic and 60% atomic. The embedded resistor may have a thickness of between about 50 Angstroms and about 500 Angstroms.

In some embodiments, the second electrode includes titanium nitride. The resistive switching layer may be formed from one of hafnium oxide, zirconium oxide, aluminum oxide, titanium oxide, tantalum oxide, or silicon oxide. The embedded resistor may be configured to block migration of materials between the second electrode and the resistive switching layer. As such, removal of oxygen from the resistive switching layer and oxidation of titanium in the second electrode may be prevented, in some embodiments. Thereby, the defect content and distribution in the resistive switching layer is controlled.

In some embodiments, the predetermined density of the embedded resistor after anneal is between about 7 g/cm$^3$ and about 12 g/cm$^3$ or, more specifically, between about 8 g/cm$^3$ and about 10 g/cm$^3$. These density ranges are believed to provide sufficient diffusion barrier characteristics of the embedded resistor without compromising its resistivity. In some embodiments, the predetermined resistivity of the embedded resistor after anneal is between about $10^2$ Ohm-cm and about $10^7$ Ohm-cm or, more specifically, between about $10^3$ Ohm-cm and about $10^5$ Ohm-cm. The resistivity of the embedded resistor may remain constant while applying an electrical field of up 8 mega-Volts/centimeter to the embedded resistor. In some embodiments, the embedded resistor has a resistance of 90 kilo-Ohm to 210 kilo-Ohm.

The embedded resistor may include a nanolaminate of one or more tantalum nitride layers and one or more silicon nitride layers. Distribution of tantalum and silicon in the embedded resistor (e.g., between its interface with the resistive switching layer and its interface with the second electrode) may be non-uniform. Alternatively, distribution of silicon within the embedded resistor may be substantially uniform. In some embodiments, any two layers of silicon nitride (or groups of such layers) may be spaced apart by substantially the same number of tantalum nitride layers so that the composition of the embedded resistor, as deposited, has a regular periodic variation. Afterward, if the materials of the tantalum-nitride layers and the silicon-nitride layers are thoroughly interdiffused (e.g., by annealing), the composition of the embedded resistor may become substantially uniform.

Provided also is a method of fabricating a ReRAM cell. The method may involve providing a substrate including a first electrode and a resistive switching layer disposed over the first electrode. The method then proceeds with depositing a stack of one or more tantalum nitride layers and one or more silicon nitride layers over the resistive switching layer. The number of the tantalum nitride layers and the number of the silicon nitride layers in the stack are selected to yield a predetermined density of the stack, a predetermined resistivity of the stack, a predetermined degree of crystallization during anneal, or combinations thereof. The stack may be deposited using an atomic layer deposition (ALD) technique. The method may then proceed with annealing the stack. In some embodiments, this anneal is performed after forming the second electrode. The stack is operable as an embedded resistor in the ReRAM cell.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIGS. 1A and 1B illustrate schematic representations of a ReRAM cell in its high resistive state (HRS) and low resistive state (LRS), in accordance with some embodiments.

FIG. 2 illustrates a plot of a current passing through a ReRAM cell as a function of a voltage applied to the ReRAM cell, in accordance with some embodiments.

DETAILED DESCRIPTION OF EXAMPLE EMBODIMENTS

Figure 3:
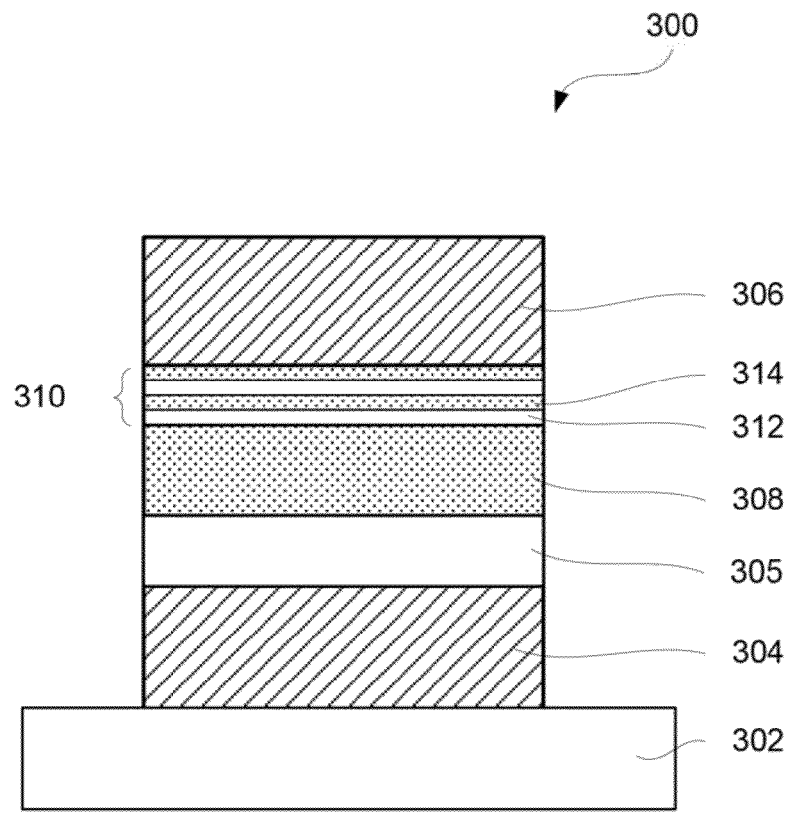
FIG. 3 illustrates a schematic representation of a ReRAM cell including an embedded resistor and other components, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles. For example, a switching voltage pulse may be used to change ("set" or "reset") the resistive state followed by a smaller reading voltage pulse to determine the current state of the ReRAM cell at that time. Unlike the switching voltage pulse, the reading pulse is specifically configured to avoid changing the resistive state of the ReRAM cell and is configured only to determine the current state. The switching pulse may be repeated if the desired resistive state is not reached. The switching pulses may alternate with the reading pulses for feedback control. The switching pulses may vary from one to another based on their potential (e.g., a gradual increase in the potential), duration, and other characteristics. The reading pulses may be the same. The process of applying the switching pulses and reading pulses may continue until the desired resistive state is reached.

The change in resistance of the resistive switching layer is a dynamic process that needs to be well controlled to prevent over-programming. For example, when the resistive switching layer is switched from its high resistive state (HRS) to its low resistive state (LRS), a rapid drop in resistance associated with this switch may cause an excessive current through the resistive switching layer and an over-programming. The over-programming occurs when change in the resistance continues even after the resistive switching layer reaches its desirable resistance. One approach to prevent over-programming is by using very short pulses, e.g., about 50 nanoseconds, followed by a reading pulse. If the desired resistive state is not reached, another pulse is applied. The process of applying switching and reading pulses may be repeated until the desired resistance is not reached. However, shorter pulses have their own inherent limitations, such as requiring more pulses or higher voltages to achieve the same switching result, which may consume more power than fewer, longer, lower-voltage pulses. Furthermore, even during a relatively short switching pulse, the change in resistance may be sufficiently large to result in current spiking and over-programming. In some embodiments, the difference in resistances between the LRS and the HRS may be more than an order of magnitude to allow the read pulses to easily differentiate between the two states.

To prevent current spiking and over-programming, an embedded resistor is connected in series with the resistive switching layer and is used to limit the current through the resistive switching layer. The embedded resistor effectively functions as a voltage divider within the ReRAM cell. Unlike the resistive switching layer, the embedded resistor maintains a constant resistance throughout the entire operation of the cell. As the degree of change of the overall ReRAM cell resistance when the resistive switching layer goes between the LRS and the HRS is not as high as the degree of change of the resistance of the resistive switching layer alone. An illustrative example may be helpful to better understand the voltage dividing aspects of an embedded resistor during resistive switching of a ReRAM cell. A ReRAM cell may have a resistive switching layer may have a resistance of 50 kOhm in its LRS and a resistance of 250 kOhm in its HRS. Without an embedded resistor, this cell will experience a five time decrease (i.e., (250 kOhm/50 kOhm) in its resistance (the resistance of electrodes is assumed to be negligible) and a corresponding current spiking, which may be damaging to the cell. On the other hand, when an embedded resistor having a constant resistance of 100 kOhm is present, the cell will experience a drop in resistance of only about 2.3 times (i.e., (250 kOhm+100 kOhm)/(50 kOhm+100 kOhm)). When an embedded resistor having a constant resistance of 200 kOhm is used instead in the same cell, the cell will experience a drop in resistance of only about 1.8 times (i.e., (250 kOhm+200 kOhm)/(50 kOhm+200 kOhm)). Overall, the change in resistance experienced the by a cell having an embedded resistor may be expressed using the following equation:

$$\text{Resistance Ratio} = \frac{R_{HRS} + R_{ER}}{R_{LRS} + R_{ER}}$$

where $R_{HRS}$ is a resistance of an resistive switching layer in its HRS, $R_{LRS}$ is a resistance of an resistive switching layer in its LRS, and $R_{ER}$ is a constant resistance of an embedded resistor. This voltage divider/constant resistance characteristic of the embedded resistor helps to prevent the current spiking and over-programming.

The embedded resistor need to have a sufficient resistance to perform as described above. In some embodiments, the resistance of the embedded resistor may be between about 90 kilo-Ohm and about 210 kilo-Ohm. Of course, this range depends on the overall design of the cells, such as respective values of the LRS and HRS resistances of the resistive switching layer, switching voltages, and the like. To achieve necessary resistance levels, a resistivity of the materials forming the embedded resistor needs to between about $10^2$ Ohm-cm and $10^7$ Ohm-cm in the operating ReRAM cell (i.e., after its fabrication). As such, the embedded resistor is clearly distinguishable from other components of ReRAM cells based on its constant resistance characteristics (compared to the resistive switching layer that is specifically designed to change its resistance) and its resistivity values (compared to signal lines and electrodes, which have substantially lower resistivities of less than 0.001 Ohm-cm).

Embedded resistors are subject to a few design and fabrication constraints. First, the thickness of embedded resistors is between about 50 Angstroms to about 500 Angstroms or, more specifically, between 20 Angstroms to about 100 Angstroms. These thickness values place significant constraints on fabrication options and even materials selections. Not every material can be formed into such thin layers and achieve the desired resistivity as well thermal and electrical stability characteristics. For example, diode activation subjects the entire ReRAM cell, including its embedded resistor, to a temperature of up to 750° C. or more for up to about 1 minute or more. In some embodiments, the embedded resistor retains its characteristics when subjected to a temperature of between about 500° C. to 1000° C. for about 10 seconds to 10 minutes. Many other materials are simply very difficult to make consistently into such thin layers. One such example is tungsten silicon nitride.

The embedded resistor material may not exhibit any significant loss in its resistivity or compromise the remaining materials in the stack by, for example, displacing some of its components into adjacent layers. The change in resistivity after being subject to the diode activation should preferably be less than an order of magnitude. In some embodiments, the embedded resistor may need to have constant resistance characteristics and demonstrate only a slight decrease in its resistance when subjecting to strong fields, e.g., up to 8 mega-Volts/centimeter. Furthermore, the material of the embedded resistor for use with a metal-oxide resistive switching layer preferably should not be oxygen-scavenging, which may interfere with the composition and performance of the resistive switching layer.

Additionally, materials used for embedded resistors should preferably be easily deposited using processes such as Atomic Layer Deposition (ALD). For example, some materials, such as tungsten nitrides, may provide suitable characteristics in a thicker bulk layer, but may be difficult to fabricate into thinner layers, e.g., below 200 Angstroms. Combining silicon and tantalum allows new ReRAM designs.

Examples of ReRAM Cells and their Switching Mechanisms

A brief description of ReRAM cells is provided for better understanding of various features of resistive switching layers described in this document. A ReRAM cell includes a resistive switching layer formed from a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

FIG. 1A illustrates a schematic representation of ReRAM cell 100 including top electrode 102, bottom electrode 106, and resistive switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", may be used identify and distinguish the two electrodes. ReRAM cell 100 may also include other components, such as current limiting layers, diodes, and other components.

Resistive switching layer 104 may be initially formed from a dielectric material. It later can be made to conduct through one or more filaments or conduction paths formed by applying first a forming voltage (after initial fabrication) and later a set voltage (during operation). To provide this resistive switching functionality, resistive switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sub-lattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Without being restricted to any particular theory, it is believed that defects 108 can be reoriented within resistive switching layer 104 to form filaments or conduction paths as, for example, schematically shown in FIG. 1B as element 110. This reorientation of defects 108 occurs when a set voltage or a forming voltage is applied to electrodes 102 and 106. Sometimes, reorientation of defects 108 is referred to as "filling the traps" when a set voltage is applied (to form one or more filaments or conduction paths) and "emptying the traps" when a reset voltage is applied (to break the previously formed filaments or conduction paths).

Defects 108 can be introduced into resistive switching layer 104 during or after its fabrication. For example, a concentration of oxygen deficiencies can be introduced into metal oxides during their deposition or during subsequent annealing.

Operation of ReRAM cell 100 will now be briefly described with reference to FIG. 2 illustrating a logarithmic plot of a current passing through a unipolar ReRAM cell as a function of a voltage applied between the electrodes of the ReRAM cell, in accordance with some embodiments. Similar characteristics are demonstrated by bipolar cells, additional details of which are further presented below. ReRAM cell 100 may be either in a low resistive state (LRS) defined by line 124 or high resistive state (HRS) defined by line 122. Each of these resistive states is used to store a different logic state, e.g., HRS may be read as logic "one" and LRS may be read as logic "zero," or vice versa. Therefore, each ReRAM cell that has two resistive states may be used to store one bit of data. It should be noted that some ReRAM cells may have three and even more resistive states allowing multi-bit storage in the same cell.

HRS and LRS correspond to the presence or absence of one or more filaments or conductive paths in resistive switching layer 104 and of connections between these filaments or conduction paths and the two electrodes 102 and 106. For example, a ReRAM cell may be initially fabricated in LRS and then switched to HRS, or vice versa. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). Set and reset operations may be referred to as write operations. During the read operation, the state of ReRAM cell 100 (more specifically, the resistive state of resistive switching layer 104) can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by arrow 126. It should be noted that formation or breaking of filaments or conduction paths in resistive switching layer 104 may also involve forming or breaking electrical connections between these filaments and one or both electrodes. The common factor in all these switching mechanisms is passage or blockage of current between the two electrodes.

In LRS, the resistive characteristics of ReRAM cell 100 are represented by line 124. In this LRS, when the read voltage ($V_{READ}$) is applied between electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation, as distinct from the set operation during which ReRAM cell 100 is switched from its HRS to LRS. During the reset operation, a reset voltage ($V_{RESET}$) is applied to ReRAM cell 100 to break the previously formed filaments or conduction paths in resistive switching layer 104, switching ReRAM cell 100 from its LRS to HRS as indicated by arrow 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that, without being bound by theory, are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage (VSET) and reset voltage ($V_{RESET}$) applied to the electrodes 102 and 106 and, as a result, to resistive switching layer 104. In the bipolar switching, the set voltage ($V_{SET}$) and reset voltage ($V_{RESET}$) applied to resistive switching layer 104 need to have different polarities.

In some embodiments, the set voltage ($V_{SET}$) is between about 100 mV and 10V or, in some embodiments, between about 500 mV and 5V. The length of set voltage pulses ($t_{SET}$) may be less than about 100 milliseconds, less than about 5 milliseconds, or even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, in some embodiments, greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., an $I_{SET}/I_{RESET}$ ratio) that corresponds to a set voltage ($V_{SET}$) and reset voltage ($V_{RESET}$) may be at least about 5 or, in some embodiments, at least about 10 to make the state of ReRAM cell easier to determine. ReRAM cells should be able to cycle between LRS and HRS at least about $10^3$ times or, in some embodiments, at least about $10^7$ times without failure. A data retention time ($t_{RET}$) should be at least about 5 years or, in some embodiments, at least about 10 years at a thermal stress up to 85° C. and small electrical stress, such as a constant application of the read voltage ($V_{READ}$). Other considerations may include low current leakage, such as less than about 40 A/cm² measured at 0.5 V per 20 Å of oxide thickness in HRS.

In some embodiments, the same ReRAM cell may include two or more resistive switching layers interconnected in series. Pairs of resistive switching layers may directly contact each other, or they may be separated by one or more intermediate layers.

In some embodiments, a ReRAM cell is subjected to a forming operation, during which the initially insulating properties of the resistive switching layer are altered and the ReRAM cell is configured into the initial LRS or HRS. The forming operation may include a very short high discharge current peak associated with a forming voltage. The LRS level of the resistive switching layer for subsequent switching is determined by the filaments or connections created by the forming operation. If the forming operation makes the resistive-switching layer too conductive, the cell may be difficult to reset. In this case, a resistive switching layer with very low levels of resistance in the LRS may be limited in terms of scaling down. This difficulty may be resolved by positioning such resistive switching layers in series with other components providing additional resistance to the overall ReRAM cell.

Examples of ReRAM Cells Having Embedded Resistors

FIG. 3 is a schematic illustration of ReRAM cell 300, in accordance with some embodiments. ReRAM cell 300 may be disposed on substrate 302 that may include other ReRAM cells, layers, or structures (not shown in FIG. 3A). ReRAM cell 300 includes first electrode 304 and second electrode 306. In some embodiments, first electrode 304 and/or second electrode 306 extend laterally to connect to other ReRAM cells, for example, in a cross-bar arrangement further described below. ReRAM cell 300 also includes resistive switching layer 308. Resistive switching layer 308 is disposed between first electrode 304 and second electrode 306. Furthermore, ReRAM cell 300 includes embedded resistor 310 disposed between second electrode 306 and resistive switching layer 308. In some embodiments, ReRAM cell 300 may include one or more other components, such as current steering element 305, transistors, additional intermediate electrodes, and the like. Each of these components will now be described in more detail.

Electrodes 304 and 306 provide electrical connections to ReRAM cell 300. For example, electrodes 304 and 306 may extend between multiple ReRAM cells, which may be cells provided in the same row or the same column of a memory array as further described below with reference to FIGS. 6A and 6B. Electrodes 304 and 306 may be made from conductive materials, such as n-doped polysilicon, p-doped polysilicon, titanium nitride, ruthenium, iridium, platinum, and tantalum nitride. Electrodes 304 and 306 may have a thickness of less than about 1,000 Angstroms, such as less than about 500 Angstroms and even less than about 100 Angstroms. Thinner electrodes may be formed using ALD techniques.

An optional current steering element 305 may be disposed in between first electrode 304 and resistive switching layer 308. Current steering element 305 may be a p-n junction diode, p-i-n diode, transistor, or other similar device. In some embodiments, current steering element 305 may include two or more layers of a semiconductor material, such as two or more doped silicon layers, that are configured to direct the flow of current through the device. Current steering element 305 may be a diode that includes a p-doped silicon layer, an un-doped intrinsic layer, and an n-doped silicon layer. These layers are not specifically identified in FIG. 3. The overall resistance of current steering element 305 may be between about 1 kilo-Ohm and about 100 Mega-Ohm. The overall resistance generally depends on the type of current steering element 305 and direction of the current flow through current steering element 305 (e.g., forward or reverse biased).

Resistive switching layer 308 can be fabricated from a dielectric material, such as a metal oxide material or other similar material that can be switched between two or more stable resistive states. In some embodiments, resistive switching layer 308 is fabricated from a high bandgap material, e.g., a material that has a bandgap of at least about 4 electron Volts. Some examples of such materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$) and zirconium oxide ($Zr_xO_y$). The high bandgap materials may improve data retention in ReRAM cell 300 and reduce the current leakage since the amount of trapped charge in these materials is less than a lower bandgap material. Furthermore, the high bandgap materials create a large barrier height that the carriers have to cross during the read, set, and reset operations. Other suitable materials for resistive switching layer 306 include titanium oxide ($TiO_x$), nickel oxide ($NiO_x$) and cerium oxide ($CeO_x$). Furthermore, semi-conductive metal oxide (p-type or n-type), such as zinc oxides ($Zn_xO_y$), copper oxides ($Cu_xO_y$), and their nonstoichiometric and doped variants can be used for resistive switching layer 308.

In some embodiments, resistive switching layer 308 includes a dopant that has an affinity for oxygen, such as various transition metals (e.g., aluminum, titanium, and zirconium), to form a metal-rich resistive switching layer, such as a non-stoichiometric oxide (e.g., $HfO_{1.5}$-$HfO_{1.9}$ or, more specifically, $HfO_{1.7}$). The dopant may be the same material as a metal of the base oxide (e.g., $HfO_2$ doped with hafnium) or different (e.g., HfO2 doped with aluminum, titanium, and zirconium). Oxygen deficiency of the metal-rich resistive switching layer corresponds to a number of oxygen vacancies, which are believed to be defects responsible for resistive switching. The amount of defects is controlled to achieve certain switching and forming voltages or operating currents, or to improve performance consistency and data retention.

Resistive switching layer 308 may have a thickness of between about 10 Angstroms and about 1000 Angstroms, such as between about 20 Angstroms and 200 Angstroms or, more specifically, between about 50 Angstroms and 100 Angstroms. Thinner resistive switching layers may be deposited using ALD, while thicker resistive switching layers may be deposited using may be deposited using ALD as well as physical vapor deposition (PVD) and, in some embodiments, chemical vapor deposition (CVD).

Embedded resistor 310 includes tantalum, silicon, and nitrogen. Tantalum nitride provides good diffusion barrier properties to embedded resistor 310. Furthermore, tantalum nitride is stable to oxidation in comparison to other materials, such as titanium nitride. The oxidation stability is beneficial to an embedded resistor 310 adjacent to resistive switching layer 308 formed from one or more metal oxides. In this example, the oxidation stability prevents removal of oxygen from resistive switching layer 308 and helps maintain the composition of resistive switching layer 308 over the operation lifetime of ReRAM cell 100.

On the other hand, if embedded resistor 310 is formed from tantalum nitride without any silicon, then the resistivity of tantalum nitride alone may not be sufficient to achieve a desired resistance (voltage dividing characteristics) for allowable thickness. There is a strong scalability trend to keep all components as small as possible. Furthermore, tantalum nitride tends to crystallize and change its properties when annealed, as further described below with reference to FIGS. 7A-7B and FIGS. 8A-8B. Addition of silicon or silicon nitride to tantalum nitride allows a much broader range of possible resistivity values. It also helps to reduce crystallization of embedded resistor 310 particularly during anneal. At the same time, tantalum nitride cannot be completely replaced with silicon nitride, as silicon nitride is susceptible to oxidation. Furthermore, the resistivity of silicon nitride is generally too high to achieve a desired resistance (voltage dividing characteristics) for a typical deposition thickness. Depositing thinner layers may be challenging and these layers may be not consistent and/or conformal.

The tantalum silicon nitride composition of embedded resistor 310 may be represented by the following formula, $Ta_XSi_YN$, in which X and Y are both greater than zero (i.e., X>0 and Y>0). X and Y may be specifically selected to yield a particular predetermined density and/or a particular predetermined resistivity of embedded resistor 310 listed elsewhere in this document. Furthermore, X and Y may be selected to reduce crystallization of $Ta_XSi_YN$ during anneal. In some embodiments, the atomic ratio of X to Y is between about 0.5:1 and about 15:1 or, more specifically, between about 1:1 and about 10:1, or even between about 3:1 and about 5:1. Such atomic ratio ranges allow forming embedded resistor 310 with a suitable resistivity, stability of this resistivity to anneal, diffusion barrier properties, and other suitable properties.

To achieve these atomic ratio ranges, embedded resistor 310 may be formed as a nanolaminate having a certain number of tantalum nitride layers and a certain number of silicon nitride layers. For example, an 80 Angstroms thick embedded resistor 310 having a 3:1 atomic ratio of tantalum to silicon may be include 60 tantalum nitride layer and 20 silicon nitride layers (assuming each layer is about 1 Angstrom thick). Individual or groups of tantalum nitride layers and silicon nitride layers may alternate to achieve a more uniform (to the extent possible) distribution of tantalum and silicon in embedded resistor 310. In the above example of embedded resistor 310 having a 3:1 atomic ratio of tantalum to silicon, each pair of two layers of silicon nitride may be separated by three layers of tantalum nitride.

Alternatively, individual or groups of tantalum nitride layers and silicon nitride layers may be arrange to profile concentrations of tantalum and silicon throughout the thickness. For example, embedded resistor 310 may have a higher concentration of tantalum at its surface facing resistive switching layer 308 than at its surface facing second electrode 306. Tantalum nitride is a good diffusion barrier and its higher concentration at the surface facing resistive switching layer 308 may help to prevent materials of resistive switching layer 308 from leaving this layer and materials of embedded resistor 310 from entering resistive switching layer 308 thereby preserving resistive switching characteristics of resistive switching layer 308. Furthermore, varying concentrations of tantalum (and silicon) within embedded resistor 310 may be used to control electrical breakdown characteristics of embedded resistor 310.

In some embodiments, the concentration of nitrogen in embedded resistor 310 may be between 20% atomic and 60% atomic. The concentration of nitrogen may vary with the relative concentrations of tantalum and silicon because of their valence difference.

In some embodiments, $Ta_XSi_YN$ of embedded resistor 310 may be substantially amorphous when deposited and remain substantially amorphous after anneal. Maintaining amorphous structure allows controlling the resistance properties of embedded resistor 310 as further described below with reference to FIGS. 8A and 8B. If, on the other hand, a substantial portion of embedded resistor 310 becomes crystalline (e.g., after anneal), the resistance of embedded resistor 310 may decrease substantially, often in an uncontrollable manner as, for example, often occurs with tantalum nitride structures. Addition of silicon nitride in embedded resistor 310 allows it to preserve its amorphous structure as further described below with reference to FIGS. 7A and 7B. In some embodiments, $Ta_XSi_YN$ is configured to withstand a temperature of up to 750° C. for up to 60 seconds while remaining substantially amorphous.

In some embodiments, second electrode 306 includes titanium nitride or polysilicon. Embedded resistor 310 may operate as a diffusion blocking layer between second electrode 306 and resistive switching layer 308, preventing materials of resistive switching layer 308 from reaching second electrode 306 and materials of second electrode 306 from reaching resistive switching layer 308. Specifically, titanium nitride and polysilicon are susceptible to oxidation. However, oxidation would alter properties of these materials, e.g., increase their resistance, which may be undesirable when these materials are used in second electrode 306. Furthermore, removal of oxygen from resistive switching layer 308 may have a negative impact on its resistive switching characteristics. For example, resistive switching layer 308 may be formed from one of hafnium oxide, zirconium oxide, aluminum oxide, titanium oxide, tantalum oxide, or silicon oxide. The atomic ratio of metal to oxygen in these types of resistive switching layers 308 may be specifically controlled and may often be a higher than for corresponding stoichiometric oxides. Changing this ratio by, for example, oxidizing second electrode 306 or other components of ReRAM cell 100, may negatively impact the performance of this cell. Embedded resistor 310 may be configured to block migration of materials between second electrode 306 and resistive switching layer 308. As such, the composition of resistive switching layer 308 is maintained during fabrication or operation of ReRAM cell 100.

Diffusion barrier characteristics of embedded resistor 310 depend on relative amounts of tantalum nitride and silicon nitride. Some examples of atomic ratios are presented above. Density is another way to characterize the diffusion barrier characteristics, with more dense materials being better diffusion barriers. In some embodiments, the density of embedded resistor 310 is between about 7 g/cm$^3$ and about 12 g/cm$^3$ after anneal or, more specifically, between about 8 g/cm$^3$ and about 10 g/cm$^3$ after anneal. For reference, the density of pure tantalum nitride is about 14.3 g/cm$^3$ while the density of pure silicon nitride is 3.4 g/cm$^3$. As the amount of silicon nitride increases, the density decreases and the material loses its diffusion characteristics.

It is generally desirable to have a high resistivity of embedded resistor 310 in order to achieve a sufficient resistance without increasing the dimensions of embedded resistor 310. For example, embedded resistor 310 may be one layer in a stack that forms ReRAM cell 100 as, e.g., presented in FIG. 3. The cross-section of embedded resistor 310 may be determined by the cross-section/footprint of ReRAM cell 100, which needs to be minimized. In some embodiments, the footprint (i.e., cross-sectional area) of embedded resistor 310 may be between about 20 square nanometers and 100 square nanometers or, more specifically, between about 30 square nanometers and 60 square nanometers, such as about 60 square nanometers. The thickness of embedded resistor 310 may be between about 50 Angstroms and about 500 Angstroms. At the same time, the resistance of embedded resistor 310 may need to be between about 90 kilo-Ohm and about 210 kilo-Ohm.

Some parameters, such as the footprint, may be restricted by other design considerations. Specifically, the footprint of the device is generally fixed by the size and lateral spacing of ReRAM cells 300, and thus is generally not easily varied from one switching memory device to the next. As such, the resistance of embedded resistor 310 needs to be controlled by adjusting other parameters, such as the thickness or composition.

In some embodiments, the resistivity of embedded resistor 310 is between about 10$^2$ Ohm-cm and about 10$^7$ Ohm-cm after anneal or, more specifically, between about 10$^3$ Ohm-cm and about 10$^5$ Ohm-cm. The resistivity may be specifically tuned by adjusting the tantalum-to-silicon ratio as described below with reference to FIGS. 8A and 8B. In addition to having a sufficiently high resistivity, embedded resistor 310 may maintain its resistivity when subject to a high electrical field. In some embodiments, the resistivity of embedded resistor 310 may remain constant while applying an electrical field of up 8 mega-Volts/centimeter to embedded resistor 310.

In some embodiments, embedded resistor 310 may be in a form of a nanolaminate including one or more tantalum nitride layers and one or more silicon nitride layers. For example, a ratio of the tantalum nitride layers to the silicon nitride layers in this nanolaminate may be between about 0.5:1 and about 15:1 or, more specifically, between about 1:1 and about 10:1 or even between about 3:1 and about 5:1. The distribution of the silicon nitride layers between the tantalum nitride layers may be uniform. That is, any pair of adjacent silicon nitride layers may be spaced apart by substantially the same number of tantalum nitride layers. Alternatively, embedded resistor 310 may have a higher average tantalum-to-silicon concentration ratio at one of its surfaces that at the other due to an intentionally uneven distribution of the silicon nitride layers between the tantalum nitride layers. For example, the surface facing or interfacing resistive switching layer 308 may have a higher average tantalum-to-silicon concentration ratio than the surface facing or interfacing second electrode 306.

Processing Examples

Figure 4:
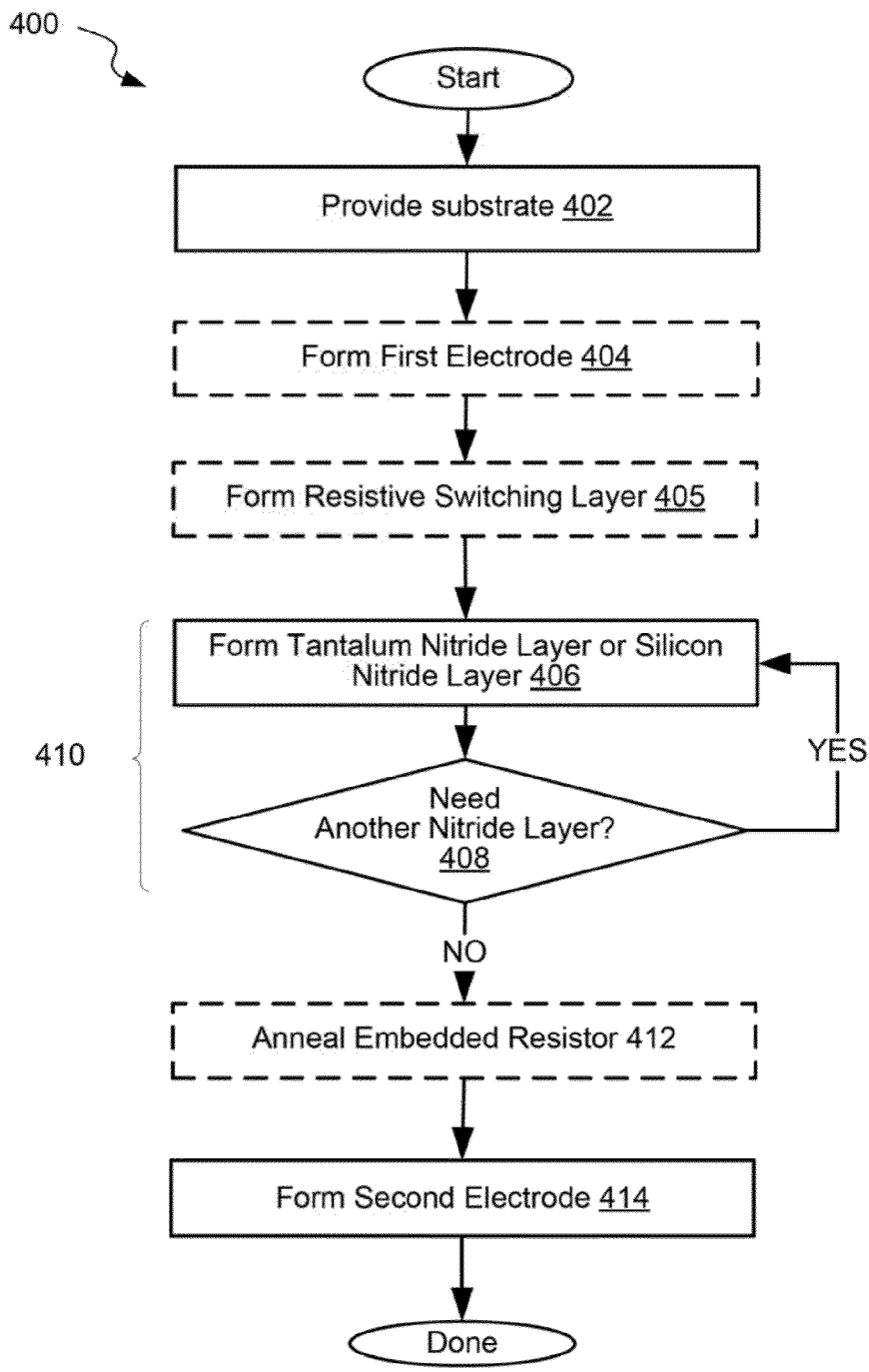
FIG. 4 illustrates a process flowchart corresponding to a method of fabricating a ReRAM cell including an embedded resistor and other components, in accordance with some embodiments.

FIG. 4 illustrates a process flow chart corresponding to method 400 of fabricating a resistive random access memory cell including an embedded resistor, in accordance with some embodiments. Method 400 may commence with providing a substrate during operation 402. In some embodiments, the substrate may include a first electrode and a resistive switching layer, in which case method 400 may proceed with forming an embedded resistor or, more specifically, with forming a stack of one or more tantalum nitride layers and one or more silicon nitride layers over the resistive switching layer during operation 410. Alternatively, method 400 may proceed with forming a first electrode on the substrate during optional operation 404 and then forming a resistive switching layer on the first electrode during optional operation 406. If the first electrode is present but the resistive switching layer is not, method 400 may proceed with forming a resistive switching layer over the first electrode during optional operation 406 and operation 404 is not performed.

In some embodiments, operation 404 may involve forming a titanium nitride electrode using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

In some embodiments, operation 406 may involve forming a resistive switching layer using ALD, PVD, CVD, or other suitable techniques. The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, PLD, CVD, evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride (HfCl$_4$), and a suitable oxidant, such as water, oxygen plasma, or ozone.

A resistive switching layer may include multiple metals. For example, one metal may be used to dope an oxide of another metal. Two or more metals may be co-deposited to form one common layer or deposited in sequences to form multiple sub-layers of the resistive switching layer. For example, PVD may be used to deposit a layer containing hafnium oxide and aluminum oxide. Specifically, a co-sputtering arrangement using either a hafnium target and an aluminum target in an oxygen containing atmosphere or a hafnium oxide target and an aluminum oxide target may be used. In another example, ALD may be used to co-inject hafnium and aluminum precursors at desired proportions to co-deposit a metal oxide layer or to form multiple sub-layers. In some embodiments, operation 404 may involve ion implantation. The ion implantation can isovalently or aliovalently dope the resistive switching layer and can reduce forming voltages, improve set and reset voltage distributions, and increase device yield.

Method 400 may then proceed with forming a stack of one or more tantalum nitride layers and one or more silicon nitride layers over the resistive switching layer during operation 410. Specifically, operation 410 may involve multiple operations 406, such than a titanium nitride layer or a silicon nitride layer is formed during each operation 406. Decision block 408 indicates that operation 406 may be repeated multiple times until the entire stack of the embedded resistor is formed.

Each operation 406 may involve an ALD cycle. One ALD cycle may be used to form a titanium nitride layer and a different ALD cycle may be used to form a silicon nitride layer. One or both of these ALD cycles may be repeated to form a required number of each layer type. Furthermore, the order of these ALD cycles determines the positions of these layers in the stack thereby controlling distribution of titanium and silicon in the embedded resistor.

Each ALD cycle involves the following four steps: introducing a titanium containing precursor or a silicon containing precursor into a deposition chamber to form an adsorbed layer, purging a portion of the precursor that was not adsorbed, introducing a nitrogen containing reactive agent to react with the adsorbed layer and form a nitride layer, and purging a portion of the nitrogen containing precursor that did not react and any reaction products from the deposition chamber. Selection of precursors, reactive agents, processing conditions (e.g., duration of each step, temperatures, concentrations of different materials, and the like) depend on the desired composition, morphology, and structure of each nitride layer in the stack. A layer formed during each ALD cycle may have a thickness of between about 0.25 Angstroms and about 2 Angstroms, averaged over the deposition area. The cycle may be repeated multiple times until the stack reaches it desired thickness. As noted above, ALD cycles are repeated using different precursors.

ALD techniques will now briefly described to provide better understanding of various processing features of the described method for fabricating a ReRAM cell. A precursor containing tantalum or silicon is introduced into the ALD chamber and allowed to flow over the substrate surface (which may be a top surface of a previously deposited ALD layer). The precursor may be introduced in the form of a pulse. Examples of tantalum containing precursors include pentakis (dimethylamino) tantalum ($Ta(N(CH_3)_2)_5$), tris(diethylamido) (tert-butylimido) tantalum (($CH_3)_3CNTa(N(C_2H_5)_2)_3$), tris(diethylamido) (ethylimido) tantalum ($C_2H_5NTa(N(C_2H_5)_2)_3$), tris(ethylmethylamido) (tert-butylimido) tantalum ($C_{13}H_{33}N_4Ta$). Examples of silicon containing precursors include (3-Aminopropyl) triethoxysilane ($H_2N(CH_2)_3Si(OC_2H_5)_3$), n-sec-Butyl(trimethylsilyl) amine ($C_7H_{19}NSi$), chloropentamethyldisilane (($CH_3)_3SiSi(CH_3)_2Cl$), 1,2-dichlorotetramethyldisilane ($[ClSi(CH_3)_2]_2$), 1,3-diethyl-1,1,3,3-tetramethyldisilazane ($C_8H_{23}NSi_2$), 1,2-dimethyl-1,1,2,2-tetraphenyldisilane (($SiCH_3(C_6H_5)_2)_2$), dodecamethylcyclohexasilane (($Si(CH_3)_2)_6$), hexamethyldisilane (($Si(CH_3)_3)_2$), hexamethyldisilazane, ($CH_3)_3SiNHSi(CH_3)_3$, methylsilane ($CH_3SiH_3$), 2,4,6,8,10-pentamethylcyclopentasiloxane (($CH_3SiHO)_5$), pentamethyldisilane (($CH_3)_3SiSi(CH_3)_2H$), silicon tetrabromide ($SiBr_4$), silicon tetrachloride ($SiCl_4$), tetraethylsilane ($Si(C_2H_5)_4$), 2,4,6,8-tetramethylcyclotetrasiloxane (($HSiCH_3O)_4$), 1,1,2,2-Tetramethyldisilane (($CH_3)_2SiHSiH(CH_3)_2$), tetramethylsilane ($Si(CH_3)_4$), n,n',n''-tri-tert-butylsilanetriamine ($HSi(HNC(CH_3)_3)_3$), tris(tert-butoxy)silanol ((($CH3)3CO)3SiOH$), and tris(tert-pentoxy)silanol (($CH_3CH_2C(CH_3)_2O)_3SiOH$). The introduced precursor at least partially adsorbs (e.g., saturatively chemisorbs or physisorbs) on the deposition surface, which may be a part the resistive switching layer or a part of the previously deposited nitride layer. Subsequent purging with a purging gas removes any precursor that did not adsorb on the surface.

After pulsing and purging of the precursor containing tantalum or silicon, the cycle continues with introduction of a nitrogen containing reagent into the chamber. Some examples of nitrogen containing reagents include ammonia ($NH_3$), alkyl amides, alkyl amines (e.g., tert-butylamine and allylamine), hydrazine ($N_2H_4$), and triazine ($N_3H_5$). The nitrogen containing reagent reacts with the adsorbed precursor to form either tantalum nitride or silicon nitride. In some embodiments, process conditions and/or nitrogen containing reagent used to form tantalum nitride may be different than that used to form silicon nitride. For example, ammonia reacts with more easily with tertiarybutylimido,tris(diethylamino)Tantalum (TBTDETa) than within tris(dimethylamino)silane (3DMAS). As such, the ammonia flow rate and/or the pulse duration may be greater for silicon nitride deposition cycles than for tantalum nitride deposition cycles using these precursors. Alternatively, tantalum nitride may be deposited using ammonia and TBTDETa, while silicon nitride may be deposited using hydrazine and 3DMAS. Reaction byproducts and excess reactants are then purged from the deposition chamber. The saturation during the reaction and purging stages makes the growth self-limiting. This feature helps to improve deposition uniformity and conformality and allows more precise control of the resulting resistive switching characteristics.

The temperature of the substrate during ALD may be between about 200° C. to 350° C. The precursor may be either in gaseous phase, liquid phase, or solid phase. If a liquid or solid precursor is used, then it may be transported into the chamber an inert carrier gas, such as helium or nitrogen.

The ALD cycles are repeated as shown by decision block 408 until the entire stack of layers is formed. This stack may be also referred to as a nanolaminate. At least two ALD cycles (e.g., operation 406) are performed: one to deposit a titanium nitride layer and one to deposit a silicon nitride layer. Overall, the number of cycles, precursors used in each cycle, and processing conditions of each cycle is determined by the design of the embedded resistor as described above with reference to FIG. 3.

Method 400 may proceed with annealing of the assembly that includes the embedded resistor prior to forming a second electrode as shown by block 412 in FIG. 4. Annealing operation 412 may be performed in addition to another annealing operation that may be, for example, used later to activate diodes. Unlike a diode-activation annealing operation, which is typically performed at high temperatures and lasts only a short period of time, operation 412 may be configured to provide more uniform distribution of tantalum and/or silicon in the embedded resistor. For example, when the embedded resistor is formed as a nanolaminate, at least initially, all silicon is present in silicon nitride layers and all tantalum is present in tantalum nitride layers. Operation 412 may be configured to stimulate interdiffusion of tantalum and/or silicon between nanolaminate layers within the embedded resistor. In some embodiments, after operation 412, the concentration of tantalum and/or the concentration of silicon is substantially uniform throughout the embedded resistor.

Operation 412 may be performed before forming a second electrode during operation 414 (as shown in FIG. 4) or after forming the second electrode.

Method 400 may proceed with forming the second electrode during operation 414. The second electrode may also be deposited in a manner similar to the first electrode as described above with reference to operation 404. Other layers, such as interface or capping layers, current limiting layers, and other layers may be deposited in the stack, e.g., between the top electrode and the resistive switching layer and/or between the bottom electrode and the resistive switching layer. In some embodiments, an intermediate electrode may be formed between the resistive switching layer and the embedded resistor.

Apparatus Examples

Figure 5:
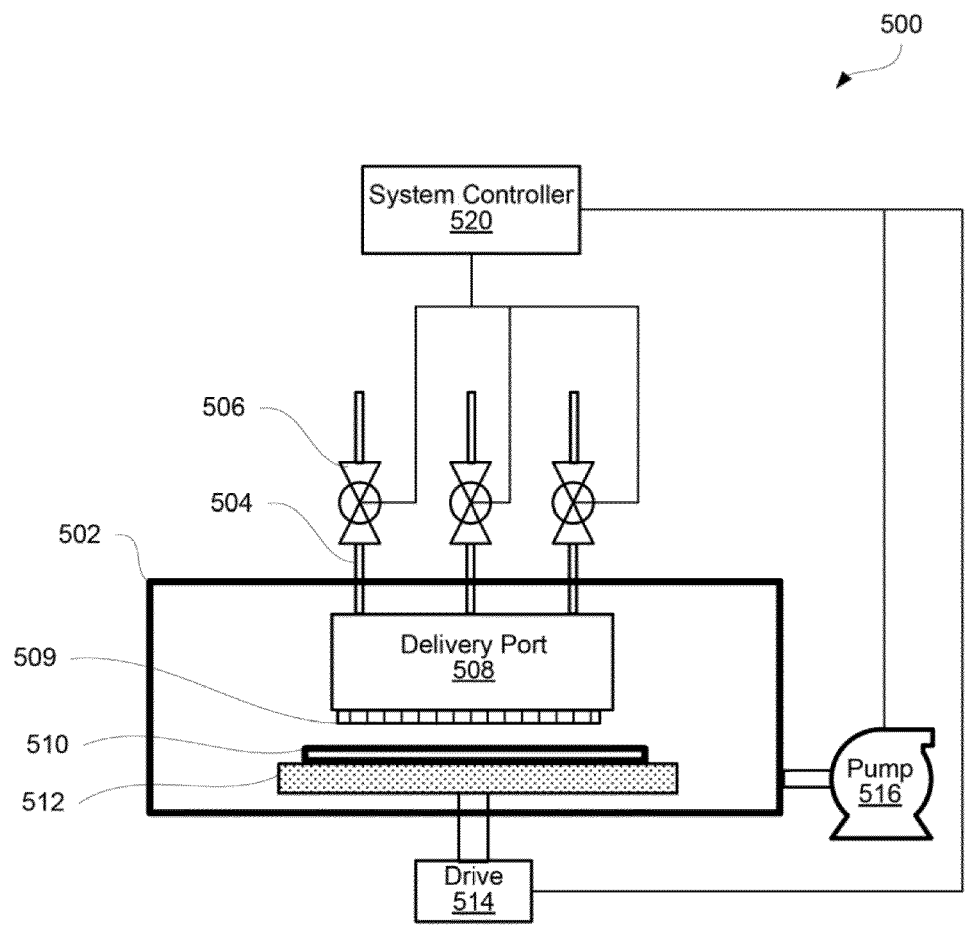
FIG. 5 illustrates a schematic representation of an atomic layer deposition (ALD) apparatus for fabricating ReRAM cells, in accordance with some embodiments.

FIG. 5 illustrates a schematic representation of ALD apparatus 500 for fabricating ReRAM cells, in accordance with some embodiments. For clarity, some components of apparatus 500 are not included in this figure, such as a wafer-loading port, wafer lift pins, and electrical feed-throughs. Apparatus 500 includes deposition chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into deposition chamber 502. In some embodiments, gases are provided into delivery port 508 prior to exposing substrate 510 to processing gases. Delivery port 508 may be used for premixing gases (e.g., precursors and diluents) and evenly distributing the gases over the surface of substrate 510. Delivery port 508 is sometimes referred to as a showerhead. Delivery port 508 may include a diffusion plate 509 having with multiple holes for gas distribution.

Deposition chamber 502 encloses substrate support 512 for holding substrate 510 during its processing. Substrate support 512 may be made from a thermally conducting metal (e.g., W, Mo, Al, Ni) or other like materials (e.g., a conductive ceramic) and may be used to maintain the substrate temperature at desired levels. Substrate support 512 may be connected to drive 514 for moving substrate 510 during loading, unloading, process set-up, and sometimes even during processing. Deposition chamber 502 may be connected to vacuum pump 516 for evacuating reaction products and unreacted gases from deposition chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Memory Array Examples

A brief description of memory arrays will now be described with reference to

Figure 6A:
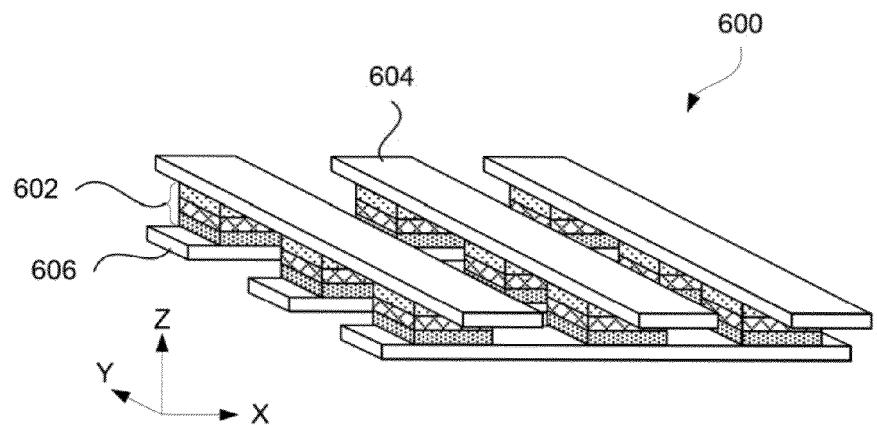
FIGS. 6A and 6B illustrate schematic views of memory arrays including multiple ReRAM cells, in accordance with some embodiments.
Figure 6B:
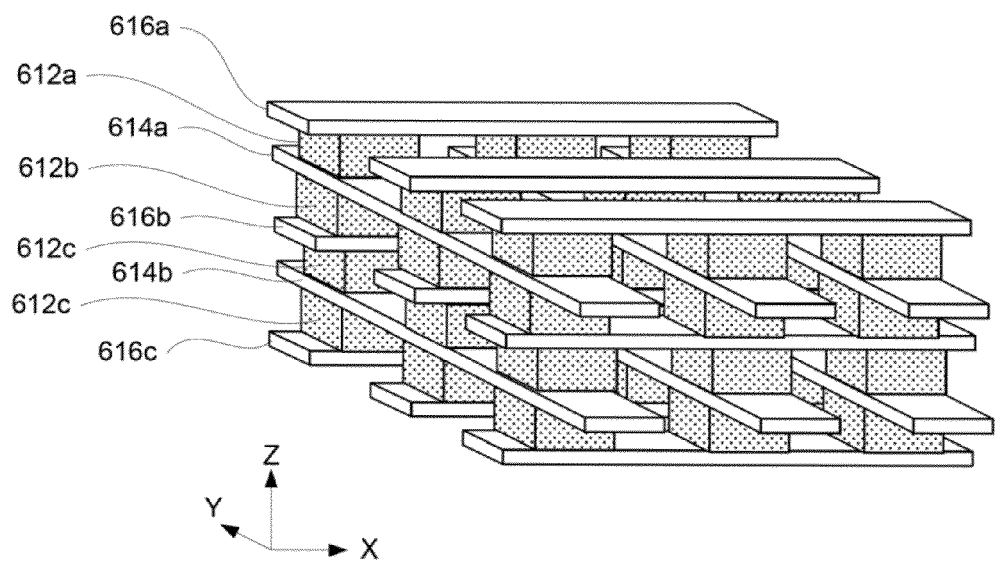

FIGS. 6A and 6B to provide better understanding of various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices, each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, in some embodiments, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, in some embodiments, embedded into each cell to decouple the cell if it is not addressed. This approach significantly reduces crosstalk in the matrix of the memory device.

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets of ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Experimental Results

An experiment was conducted to determine densities of embedded resistors having different compositions and effects of these compositions on changes in density during annealing. The embedded resistors had varying a ratio of tantalum nitride layers to silicon nitride layers. A first set of samples was prepared without using any silicon nitride layers. As such, all layers were tantalum nitride layers. A second set of samples included one layer of silicon nitride for each ten layers of tantalum nitride. A third set of samples included one layer of silicon nitride for each five layers of tantalum nitride. A fourth set of samples included one layer of silicon nitride for each three layers of tantalum nitride. Finally, a fifth set of samples includes one layer of silicon nitride for each layer of tantalum nitride. A density of each sample as deposited was measured. The average values are presented in the table below. Then all samples were subjected to anneal at 750° C. for 60 seconds. A density of each sample was measured again after the anneal and the average values are also presented in the table below. The changes in density for each set was calculated and also presented in this table.

TABLE

| Set | Sample Description | Density (g/cm$^3$) - as Deposited | Density (g/cm$^3$) - after Anneal | Change in Density |
|---|---|---|---|---|
| 1 | TaN (only) | 9.36 | 10.39 | 11.0% |
| 2 | TaN$x$10—SiN$x$1 | 8.65 | 9.79 | 13.2% |
| 3 | TaN$x$5—SiN$x$1 | 7.78 | 8.77 | 12.7% |
| 4 | TaN$x$3—SiN$x$1 | 7.16 | 8.2 | 14.5% |
| 5 | TaN$x$1—SiN$x$1 | 5.42 | 5.96 | 10.0% |

As expected, addition of silicon nitride layers caused reduction in density of the samples. Silicon nitride is less dense than tantalum nitride.

Figure 7A:
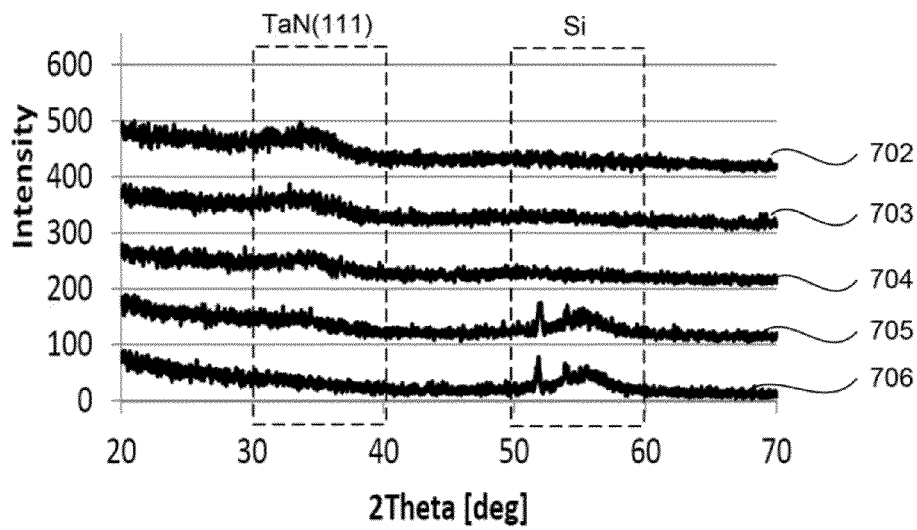
FIGS. 7A and 7B illustrate X-ray diffraction (XRD) plots corresponding to embedded resistors having different compositions of tantalum and silicon before and after anneal.
Figure 7B:
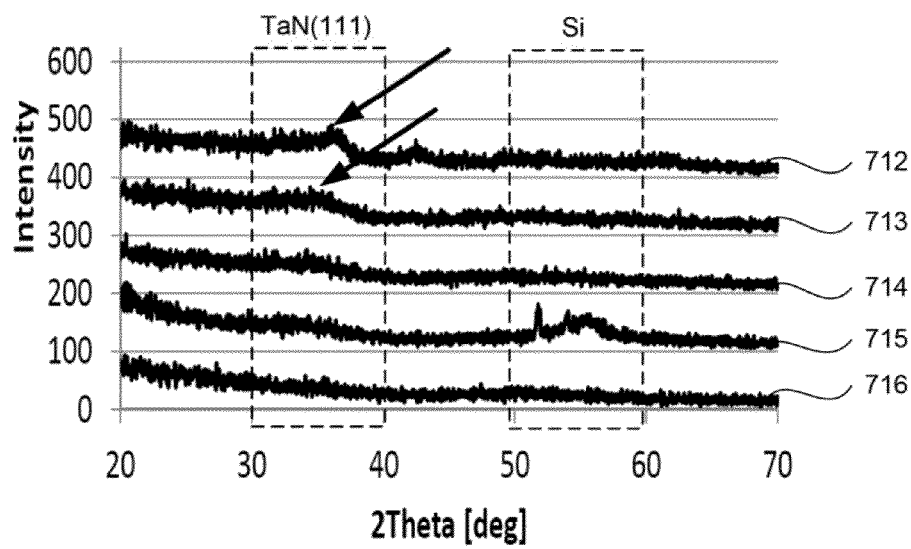

FIGS. 7A and 7B illustrate X-ray diffraction (XRD) plots corresponding to embedded resistors having different compositions of tantalum and silicon before and after anneal. Specifically, FIG. 7A illustrates XRD plots of embedded resistors prior to anneal and FIG. 7B illustrates XRD plots of the same embedded resistors after anneal. Lines 702 and 712 correspond to embedded resistors that did not have any silicon nitride layers (i.e., TaN only). In other words, all layers of these embedded resistors were tantalum nitride. Lines 703 and 713 correspond to embedded resistors that had one silicon nitride layer for each ten tantalum nitride layers (i.e., TaNx10-SiNx1). Lines 704 and 714 correspond to embedded resistors that had one silicon nitride layer for each five tantalum nitride layers (i.e., TaNx5-SiNx1). Lines 705 and 715 correspond to embedded resistors that had one silicon nitride layer for each three tantalum nitride layers (i.e., TaNx3-SiNx1). Lines 706 and 716 correspond to embedded resistors that had one silicon nitride layer for each one tantalum nitride layer (i.e., TaNx1-SiNx1).

Areas where tantalum nitride (111) crystallization peaks and silicon crystallization peaks, if present, would be expected to appear are indicated within the two rounded-rectangle outlines in each figure. As expected, no peaks were found in the XRD plots shown in FIG. 7A that correspond to the embedded resistors prior to annealing. A couple of peaks were identified in the XRD plots shown in FIG. 7B (indicated by arrows). These peaks were parts of line 712 corresponding TaN only embedded resistor and line 713 corresponding to TaNx10-SiNx1 embedded resistors. No peaks were detected in XRD plots corresponding to other embedded resistors, i.e., embedded resistors having higher concentrations of silicon nitride or made only from silicon nitride. These results confirmed that addition of silicon nitride into tantalum nitride suppresses crystallization during anneal. Maintaining the amorphous structure of an embedded resistor should help with keeping its resistivity at high levels as will now be explained with reference to FIGS. 8A and 8B.

Figure 8A:
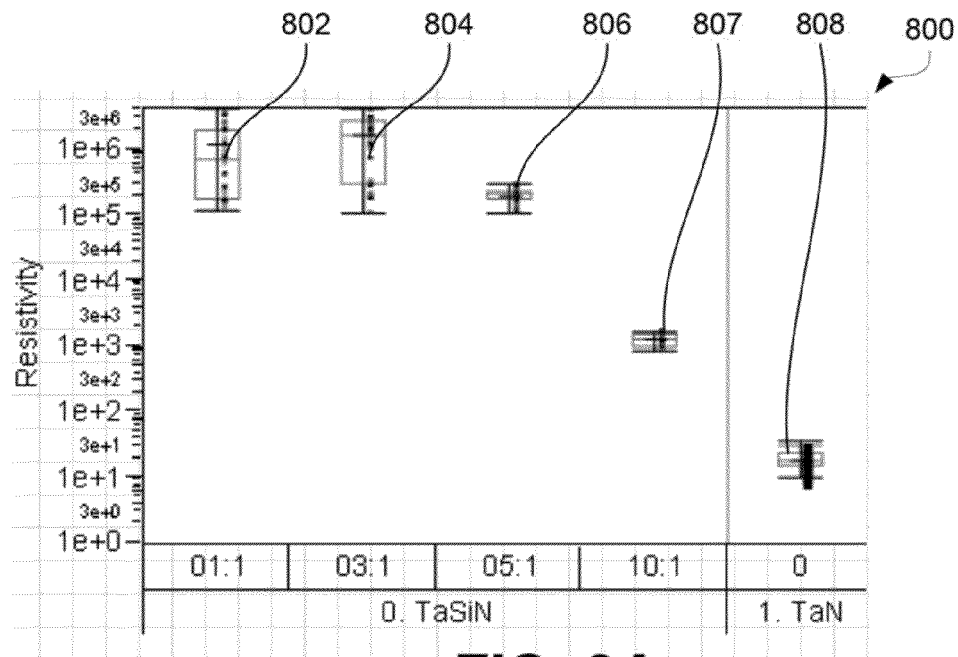
FIGS. 8A and 8B illustrate resistivity data corresponding to embedded resistors having different compositions of tantalum and silicon before and after anneal.
Figure 8B:
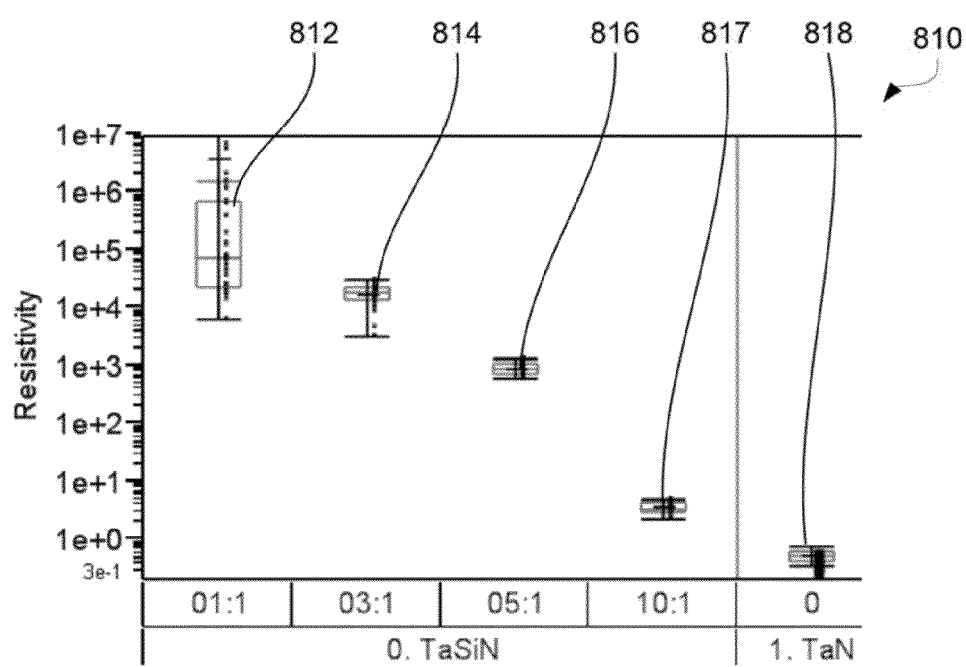

FIGS. 8A and 8B illustrate resistivity data corresponding to embedded resistors having different compositions of tantalum and silicon before and after anneal. Specifically, groups 802 and 812 correspond to embedded resistors that had one silicon nitride layer for each one tantalum nitride layer (i.e., TaNx1-SiNx1). Groups 804 and 814 correspond to embedded resistors that had one silicon nitride layer for three tantalum nitride layers (i.e., TaNx3-SiNx1). Groups 806 and 816 correspond to embedded resistors that had one silicon nitride layer for five tantalum nitride layers (i.e., TaNx5-SiNx1). Groups 807 and 817 correspond to embedded resistors that had one silicon nitride layer for ten tantalum nitride layers (i.e., TaNx10-SiNx1). Finally, groups 808 and 818 correspond to embedded resistors that had only tantalum nitride layers (i.e., TaN only). Both figures (before and after annealing) indicate a significantly higher resistance when more silicon nitride is present in the embedded resistors. While this increase in resistance may be desirable from scalability perspectives (i.e., achieve the same resistance with a smaller component), addition of silicon nitride also made resistivity of the embedded resistors less consistent (at least after the annealing) as, for example, can be seen from the spread of data points in group 812. At the same time, the embedded resistors with lowest silicon nitride content (or no silicon nitride present) demonstrated much greater decrease in resistivity during anneal. In fact, the highest drop in resistivity was attributed to the samples with no silicon nitride present, which is evident from relative resistivity values for groups 808 and 818. This finding supports the XRD data reported above indicating the embedded resistors with lower silicon nitride content tend to be more susceptible to crystallization and, therefore, tend to lose their resistivity more.

Conclusion

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method comprising:
    forming a first conductive layer on a substrate,
        wherein the first conductive layer is operable as an electrode;
    forming a resistive switching layer over the first conductive layer,
        wherein the resistive switching layer is operable to switch between at least two different resistive state;
    forming a stack of one or more tantalum nitride layers and one or more silicon nitride layers over the resistive switching layer,
        wherein the stack is deposited using an atomic layer deposition technique; and
    annealing the stack, thereby forming an embedded resistor from the stack.

2. The method of claim 1, further comprising forming a second conductive layer over the embedded resistor, wherein the second conductive layer is operable as an electrode.

3. The method of claim 1, wherein a number of the tantalum nitride layers and a number of the silicon nitride layers is such that an atomic ratio of tantalum to silicon in the embedded resistor is between about 0.5:1 to 15:1.

4. The method of claim 1, wherein the embedded resistor has a uniform distribution of tantalum or silicon in the layer.

5. The method of claim 1, wherein the embedded resistor has a nonuniform distribution of tantalum and silicon in the layer.

6. The method of claim 1, wherein the embedded resistor directly interfaces the resistive switching layer.

7. The method of claim 1, wherein a concentration of tantalum and a concentration of silicon in the embedded resistor are selected to reduce crystallization in the embedded resistor during annealing.

8. The method of claim 1, wherein a number of the tantalum nitride layers and a number of the silicon nitride layers is such that an atomic ratio of tantalum to silicon in the embedded resistor is between about 1:1 to 10:1.

9. The method of claim 1, wherein a number of the tantalum nitride layers and a number of the silicon nitride layers is such that an atomic ratio of tantalum to silicon in the embedded resistor is between about 3:1 to 5:1.

10. The method of claim 1, wherein the embedded resistor is substantially amorphous after the annealing.

11. The method of claim 1, wherein a concentration of nitrogen in the embedded resistor is between 20% atomic and 60% atomic.

12. The method of claim 1, wherein the embedded resistor has a thickness between 50 Angstroms and 500 Angstroms.

13. The method of claim 1, wherein the resistive switching layer comprises one of hafnium oxide, zirconium oxide, aluminum oxide, titanium oxide, tantalum oxide, or silicon oxide.

14. The method of claim 1, wherein the resistive switching layer comprises silicon oxide and one of hafnium oxide, zirconium oxide, aluminum oxide, titanium oxide, or tantalum oxide.

15. The method of claim 1, wherein a density of the embedded resistor is between 7 g/cm$^3$ and 12 g/cm$^3$ after the annealing.

16. The method of claim 1, wherein a density of the embedded resistor is between 8 g/cm$^3$ and 10 g/cm$^3$ after the annealing.

17. The method of claim 1, wherein a resistivity of the embedded resistor is between $10^2$ Ohm-cm and $10^7$ Ohm-cm after the annealing.

18. The method of claim 1, wherein a resistivity of the embedded resistor is between $10^3$ Ohm-cm and $10^5$ Ohm-cm after the annealing.

19. The method of claim 1, wherein a resistivity of the embedded resistor is constant in an applied electrical field of up to 8 mega-Volts/centimeter.

20. The method of claim 1, wherein forming the one or more tantalum nitride layers comprises using ammonia and tertiarybutylimido, tris(diethylamino)tantalum, and wherein forming the one or more silicon nitride layers comprises using hydrazine and tris(dimethylamino)silane.

* * * * *